(12) United States Patent
Hofmann et al.

(10) Patent No.: US 6,534,820 B2
(45) Date of Patent: Mar. 18, 2003

(54) INTEGRATED DYNAMIC MEMORY CELL HAVING A SMALL AREA OF EXTENT, AND A METHOD FOR ITS PRODUCTION

(75) Inventors: Franz Hofmann, München (DE); Wolfgang Krautschneider, Hamburg (DE); Till Schlösser, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/745,565

(22) Filed: Dec. 21, 2000

(65) Prior Publication Data

US 2001/0017795 A1 Aug. 30, 2001

(30) Foreign Application Priority Data

Dec. 21, 1999 (DE) .......................... 199 61 779

(51) Int. Cl.[7] .............................. H01L 29/788
(52) U.S. Cl. .................. 257/315; 257/295; 257/296; 257/310; 257/358; 257/513; 257/518; 437/60
(58) Field of Search ................. 257/295, 296, 257/310, 358, 513, 518, 544; 437/60

(56) References Cited

U.S. PATENT DOCUMENTS 4,704,368 A * 11/1987 Goth et al. ................. 438/329

FOREIGN PATENT DOCUMENTS

| DE | 197 27 436 C1 | 10/1998 |
|---|---|---|
| DE | 197 23 936 A1 | 12/1998 |
| DE | 197 27 466 A1 | 1/1999 |
| EP | 0 537 203 B1 | 4/1993 |
| EP | 0 917 203 A2 | 5/1999 |

* cited by examiner

*Primary Examiner*—David Nelms
*Assistant Examiner*—Mai-Huong Tran
(74) *Attorney, Agent, or Firm*—Laurence A. Greenberg; Werner H. Stemer; Gregory L. Mayback

(57) ABSTRACT

An integrated dynamic memory cell having a small area of extent on a semiconductor substrate is described. The memory cell has a selection MOSFET with a gate connection area that is connected to a word line, a source connection doping area which is connected to a bit line, and a drain connection doping area. A memory MOSFET has a gate connection area which is connected via a thin dielectric layer to a connection doping region which connects a source connection doping area of the memory MOSFET to the drain connection doping area of the selection MOSFET. The memory MOSFET further has a drain connection doping area that is connected to a supply voltage. The selection and memory MOSFETs are disposed on opposite sidewalls of a trench, which is etched in the substrate, and the connection doping region forms a bottom of the trench.

16 Claims, 5 Drawing Sheets

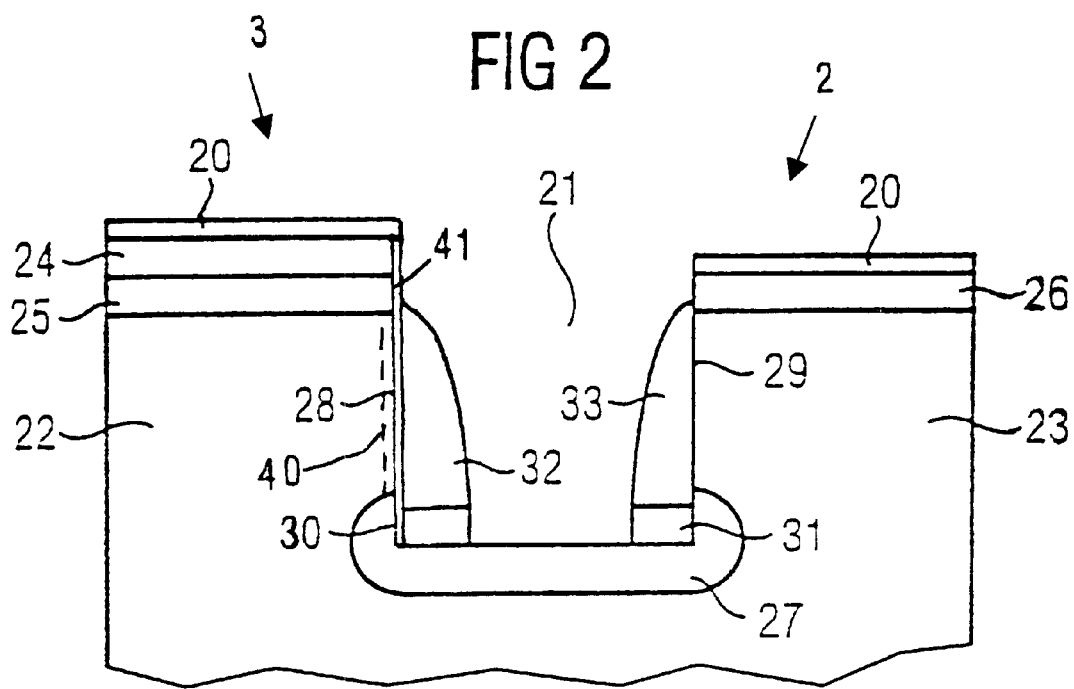
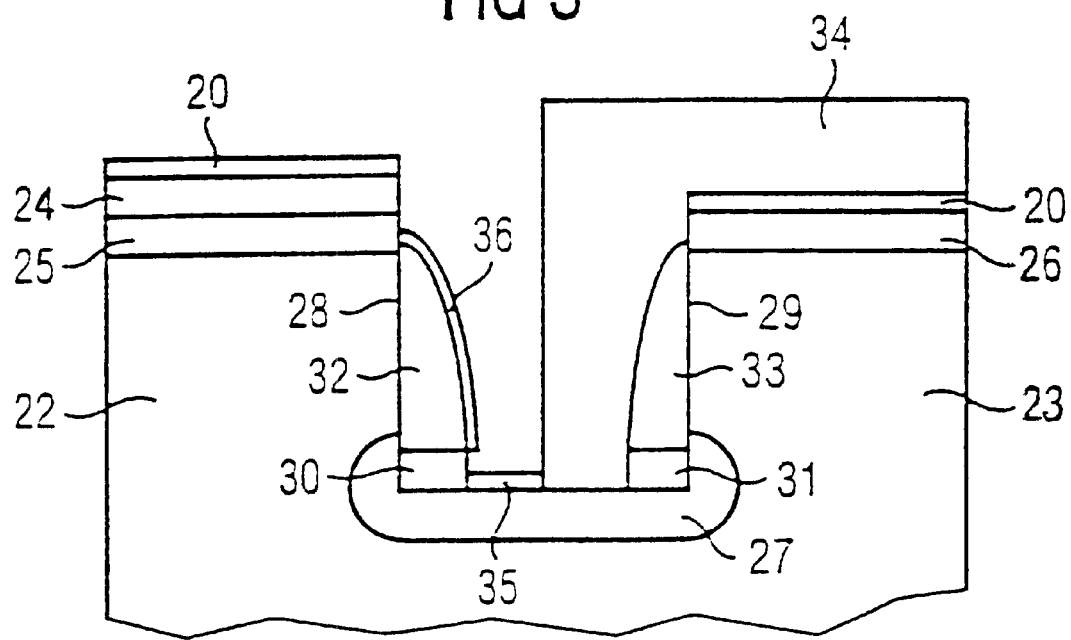

US 6,534,820 B2

INTEGRATED DYNAMIC MEMORY CELL HAVING A SMALL AREA OF EXTENT, AND A METHOD FOR ITS PRODUCTION

BACKGROUND OF THE INVENTION

FIELD OF THE INVENTION

The invention relates to an integrated dynamic memory cell having a small area of extent, which is integrated in a trench which is etched in a substrate.

A dynamic semiconductor memory contains a large number of memory cells. A conventional memory cell has a memory capacitance that can be connected to a bit line via a selection transistor. If a high voltage level is applied to a word line, then the selection transistor conducts, and the memory capacitance is connected to the bit line. In this state, a data item can be written to the memory cell by the capacitance being charged or discharged to the desired memory content.

In order to provide dynamic memories with a memory capacity in the Gigabit range, a large number of memory cells must be integrated on the substrate chip area. Since the substrate chip area is limited, it is necessary to keep the area of extent of an individual integrated dynamic memory cell as small as possible. Miniaturization is in this case also governed by the lithographic technique used. The lithographic technique used defines a minimum lithographic structure size F, which is currently approximately 150 to 200 nm.

One disadvantage of the conventional memory cell is that the capacitance of the memory capacitor cannot be reduced as integration to form smaller structures increases. European Patent EP 0 537 203 B1 proposes a memory cell with two MOSFET transistors. However, the area of extent of the memory cell described there is relatively large, since the memory cell is formed in a planar fashion on the substrate surface.

SUMMARY OF THE INVENTION

It is accordingly an object of the invention to provide an integrated dynamic memory cell having a small area of extent, and a method for its production that overcome the above-mentioned disadvantages of the prior art devices and methods of this general type.

With the foregoing and other objects in view there is provided, in accordance with the invention, an integrated dynamic memory cell having a small area of extent. The memory cell is formed of a semiconductor substrate having a trench formed therein and defined by a bottom and side walls, including a first side wall and a second side wall opposite the first side wall. A selection MOSFET is disposed on the first side wall of the trench. The selection MOSFET has a gate connection area that is to be connected to a word line, a source connection doping area which is to be connected to a bit line, and a connection doping area forming the bottom of the trench and a drain connection doping area of the selection MOSFET. A thin dielectric layer is provided. A memory MOSFET is disposed on the second side wall of the trench and has a source connection doping area, a gate connection area which is connected through the thin dielectric layer to the connection doping region. The connection doping region connects the source connection doping area of the memory MOSFET to the drain connection doping area of the selection MOSFET. The memory MOSFET further has a drain connection doping area which is to be connected to a supply voltage. A connecting area formed from n-polysilicon is connected to the thin dielectric, and tunnel currents flowing through the thin dielectric layer can be varied by a doping of the connecting area and by a doping of the connection doping region. The thin dielectric layer has a thickness of less than two nm so that the tunnel currents flow between the gate connection area of the memory MOSFET and the connection doping region.

In one preferred embodiment of the dynamic memory cell according to the invention, the selection MOSFET and the memory MOSFET are each NMOS transistors.

In a further preferred embodiment of the memory cell according to the invention, the thin dielectric layer has a thickness of less than 2 nm, so that tunnel currents can pass through the thin dielectric layer.

In a further preferred embodiment, the tunnel currents which flow through the thin dielectric layer can be varied by the doping of the gate connection area and of the connection doping region.

The thin dielectric layer preferably has an asymmetric current flow characteristic similar to that of a diode.

The thin dielectric layer is preferably composed of an oxide, nitride or oxynitride.

In a further preferred embodiment of the dynamic memory cell according to the invention, the selection MOSFET and the memory MOSFET each have a gate oxide layer, and these layers run along the sidewalls of the etched trench.

In a further embodiment of the dynamic memory cell according to the invention, the gate connection areas of the selection MOSFET and of the memory MOSFET are formed by spacers.

In one preferred embodiment, the source connection areas and the drain connection areas of the two MOSFETs, and the connection doping region, are doped by ion implantation.

In a further preferred embodiment of the dynamic memory cell according to the invention, doped current-conductive channels are located alongside each of the gate oxide layers of the selection MOSFET and of the memory MOSFET and their doping can be varied in order to fix the respective switch-on voltage of the two MOSFETs.

The doped current-conductive channels are preferably doped by ion implantation.

In one particularly preferred embodiment of the dynamic memory cell according to the invention, a width of the etched trench corresponds to the minimum lithographic structure size.

The length of the doped current-conductive channels in this case preferably corresponds essentially to the depth of the etched trench.

In a further embodiment of the dynamic memory cell according to the invention, a depth of the etched trench is greater than the width of the etched trench.

The gate connection area of the selection MOSFET of a dynamic memory cell is preferably formed by a spacer that runs continuously in the etched trench and forms the gate connection area for a large number of further selection MOSFETs of other dynamic memory cells.

In a further embodiment of the memory cell according to the invention, the area of extent of the dynamic memory cell corresponds approximately to four times the square of the lithographic structure size.

Semiconductor substrate areas of selection MOSFETs of different memory cells that are disposed on one sidewall of the etched trench are preferably disposed such that they are separated from one another by insulation layers.

In a further preferred embodiment of the dynamic memory cell according to the invention, the semiconductor substrate areas of memory MOSFETs, which are disposed on an opposite side of the etched trench, are likewise separated from one another by insulation layers.

With the foregoing and other objects in view there is provided, in accordance with the invention, a method for producing an integrated dynamic memory cell. The method includes the steps of:

a) providing a semiconductor substrate having a surface;

b) implanting the surface of the semiconductor substrate;

c) etching a trench in the semiconductor substrate;

d) implanting the semiconductor substrate at a bottom of the trench to form a drain connection doping area and a connection doping region;

e) thermally oxidizing two side walls of the trench to form dielectric layers on the side walls functioning as gate insulation layers for a selection MOSFET and a memory MOSFET;

f) depositing an insulating oxide layer on the bottom of the trench;

g) forming polysilicon spacers on the side walls of the trench, the polysilicon spacers functioning as gate electrodes for the selection MOSFET and the memory MOSFET;

h) etching the insulating oxide layer with the polysilicon spacers which have been formed as masks, and with a central surface area of the semiconductor substrate that has been implanted being exposed;

i) filling one of a right-half and a left-half of the trench with an insulating material;

j) depositing a thin dielectric layer, through which tunnel currents can pass, on a remaining exposed half of the central surface area of the semiconductor substrate on the bottom of the trench; and k) depositing a polysilicon layer on the thin dielectric layer.

The method according to the invention provides a self-amplifying dynamic memory cell that requires only a very small area. The production process in this case is particularly simple, since the masks that are formed are in the form of strips, thus further simplifying the photolithography. Since the etched trench for accommodating the MOSFETs in the memory cell can be relatively deep, the current-conductive channels of the MOSFETs are also relatively long, so that leakage currents, which can flow away via the selection transistor, are particularly low. The asymmetric current flow characteristic resulting from the tunnel currents through the thin dielectric layer can be varied by the doping of the adjacent doped layers. In consequence, the dynamic response of the memory cell can be influenced appropriately for the desired application.

Other features which are considered as characteristic for the invention are set forth in the appended claims.

Although the invention is illustrated and described herein as embodied in an integrated dynamic memory cell having a small area of extent, and a method for its production it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2–5 are sectional views of further production steps for producing the integrated dynamic memory cell;

DESCRIPTION OF THE PREFERRED EMBODIMENTS

Figure 1:
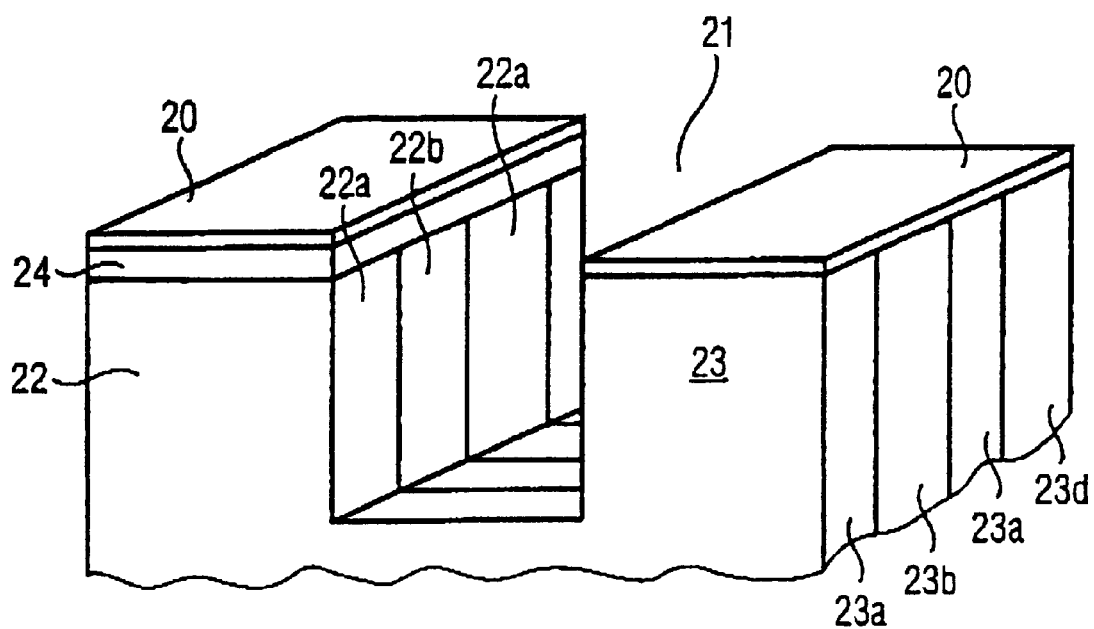
FIG. 1 is a diagrammatic, perspective view of productions steps for producing an integrated dynamic memory cell according to the invention.

In all the figures of the drawing, sub-features and integral parts that correspond to one another bear the same reference symbol in each case. Referring now to the figures of the drawing in detail and first, particularly, to FIG. 8 thereof, there is shown an integrated dynamic memory cell 1 according to the invention which contains two MOSFET transistors 2, 3. The MOSFET transistors 2, 3 are preferably NMOS MOSFETs. The memory cell 1 has a first connection 4 for connection to a word line WL, a second connection 5 for connection to a bit line BL, and a third connection 6 for connection to a supply voltage $V_{DD}$ for the memory cell 1. The word line connection 4 is connected to a gate 8 of the MOSFET 2 via a line 7. A source connection 9 of the MOSFET 2 is connected to the bit line connection 5 via a line 10. A drain connection 11 of the MOSFET 2 is connected to a source connection 13 of the MOSFET 3 via a connecting line 12. The drain connection 14 of the MOSFET 3 is connected to the supply voltage connection 6 via a line 18. A gate 15 is coupled to the connecting line 12 of the two MOSFETs 2, 3 via a component 16, which is illustrated as a diode, and a current-carrying line 17. The component 16 behaves in a similar way to a diode or an asymmetric resistor, and has an asymmetric current flow characteristic.

Figure 8:
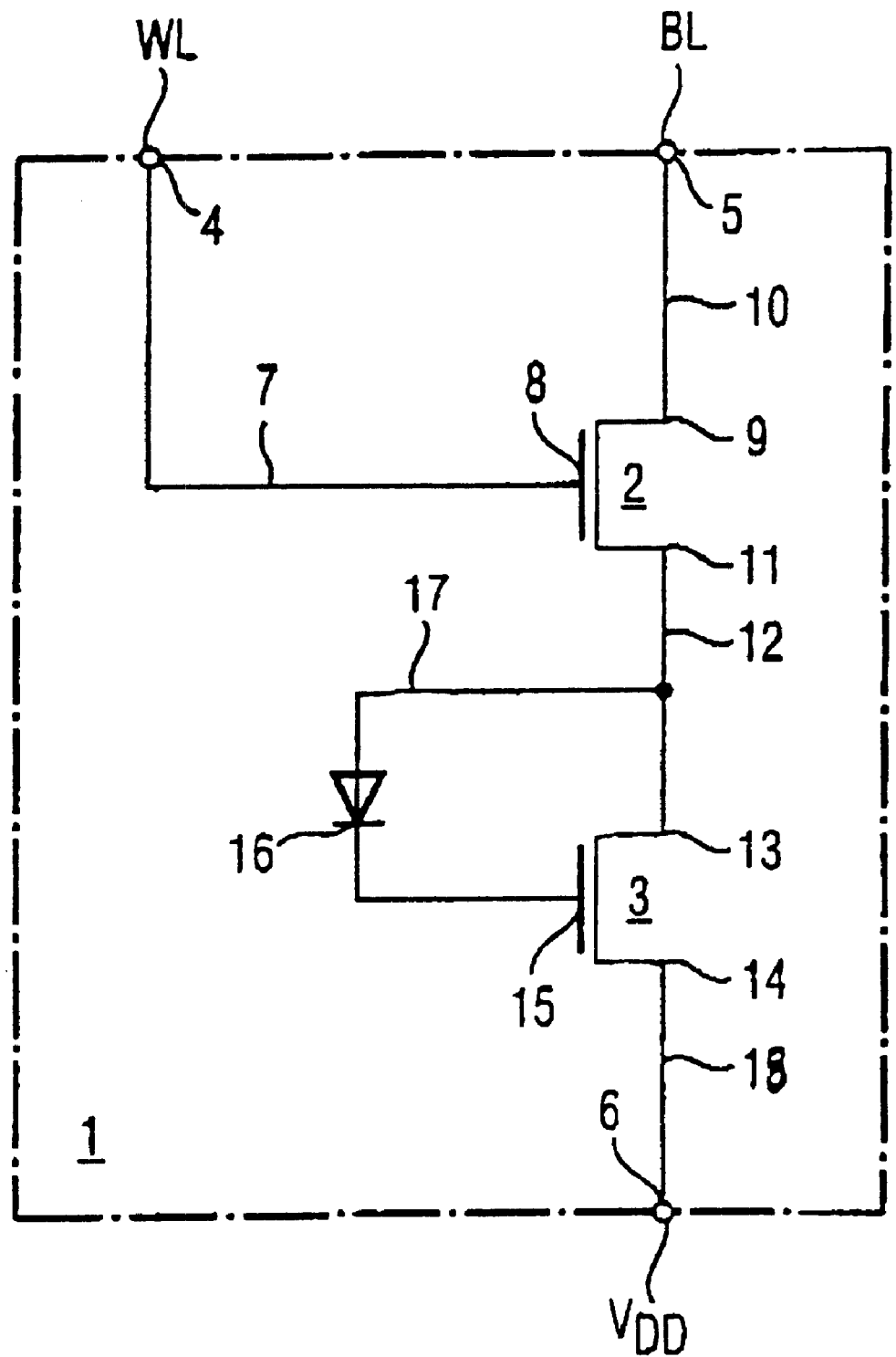
FIG. 8 is a circuit diagram of the integrated dynamic memory cell.

The memory cell according to the invention and as illustrated in FIG. 8 operates as follows.

A charge can be written to and stored in the memory cell 1. The MOSFET 2 forms the selection MOSFET of the memory cell 1, and the MOSFET 3 forms the memory MOSFET of the memory cell 1.

In order to write or store a charge in the memory MOSFET 3, the bit line connection 5 and the word line connection 4 are both raised to a high logic voltage level. The selection MOSFET 2 is switched on under the control of its gate connection 8, and the high logic voltage level is then applied to the connecting line 12 between the two MOSFETs 2, 3. The gate 15 of the memory MOSFET 3 is charged in a relatively short charging time via the component 16 which is similar to a diode. The gate 15 of the memory MOSFET 3 is used for storing the charge being written, and thus the data. The component 16, which is similar to a diode, has an asymmetric current flow characteristic. The component 16, which is similar to a diode, ensures that the charge located on the gate 15 is discharged more slowly than the charging process, and ensures that the memory transistor 3 is conducting for a predetermined time when reading a logic "1".

When reading the stored charge, the bit line connection 5 has a low logic voltage level applied to it, and the word line connection 4 is raised to a high logic voltage level in order to turn-on the selection MOSFET 2. The selection MOSFET 2 is switched-on and lowers the connecting line 12 to the low logic voltage level that is applied to the bit line connection 5. The gate 15 is discharged with a time delay via the component 16, which is similar to a diode. In this process, a relatively high current also flows, for as long as there is sufficient gate charge on the gate 15 of the memory MOSFET, via the lines 15, 12, 10 to the bit line connection 5, since both MOSFETs 2, 3 are switched on. This represents an amplification of the charge stored in the memory cell 1. The integrated dynamic memory cell 1 according to the invention is thus distinguished by the characteristic that the charge written to the memory cell 1 is less than the charge which is obtained when reading from the memory cell 1. The dynamic memory cell 1 according to the invention is thus self-amplifying.

The method according to the invention for producing the integrated dynamic memory cell 1 according to the invention and as illustrated as a circuit diagram in FIG. 8 is described in the following text.

First, a structured etching hard-mask is applied by a TEOS deposition to a semiconductor substrate, which is preferably a silicon substrate. The hard mask in this case contains a large number of strips, whose separation and width correspond approximately to a minimum lithographic structure size F. The minimum lithographic structure size F is approximately 0.1 to 0.2 $\mu$m. Insulating trenches are etched into the semiconductor substrate in a subsequent dry-etching process, with the insulating trenches being used to provide electrical isolation between the various dynamic memory cells according to the invention on the semiconductor chip. The insulating trenches are filled with an insulating material, for example an oxide. The insulating trenches are sufficiently deep to ensure effective electrical isolation between the large number of dynamic memory cells. A chemical vapor deposition (CVD) process is preferably used for filling the insulating trenches with oxide. The surface is then planarized.

In a further process step, n-ion implantation is carried out in order to dope the surface of the semiconductor substrate. In the process, ions are accelerated such that they penetrate to a specific depth in the semiconductor substrate. After the ion implantation, an n-polysilicon layer is deposited and is etched, structured by a photoresist mask, in such a way that polysilicon strips run at right angles to the insulating trenches which have been introduced and are filled with oxide. The distance between the polysilicon strips, and their widths, in this case preferably likewise correspond to the minimum lithographic structure size F. The entire structure is then coated with a structured silicon-nitride hard mask for trench etching. A dry-etching process is used to etch the silicon substrate and the insulating trenches, which run parallel in the form of strips and are filled with oxide, in order to form a trench to accommodate the MOSFET transistors 2, 3 which are to be formed for the dynamic memory cell 1.

FIG. 1 shows a structure that is obtained once the process steps mentioned above have been carried out. Located on the semiconductor substrate is a nitride hard mask 20, with a deep accommodation trench 21 being etched in the semiconductor substrate. This results in semiconductor substrate webs 22, 23. A layer 24 composed of n-doped polysilicon is located on the left-hand semiconductor substrate web 22. Respective regions 22a, 23a composed of a pure silicon substrate and areas 22b, 23b composed of an insulating oxide alternate in the two semiconductor substrate webs 22, 23.

In a further step, n-ions for doping the semiconductor substrate are implanted at a bottom of the etched trench 21. The etched trench 21 is then filled with silicon dioxide using a TEOS process and, after planarization, for example by a chemical-mechanical process (CMP), the silicon oxide with which the etched trench 21 is filled is etched back such that an insulating oxide layer remains at the bottom of the trench. The etching-back process is carried out using a dry-etching process selectively in such a way that the silicon nitride of the hard mask 20 is not attacked. With the doping ions being implanted obliquely, the sidewalls of the etched trench 21, which is now largely exposed once again, are doped to form current-conductive channels 40 for the subsequent MOSFET. The switch-on voltage of the subsequent MOSFETs is varied by the intensity of the doping. In this case, the two opposite sidewalls of the etched trench 21 may be implanted to different extents, so that the switch-on voltage of the two MOSFETs 2, 3 in the memory cell 1 can be set to be different. After the implantation, the two opposite sidewalls of the etched trench are thermally oxidized, so that a dielectric oxide layer 41 is formed there. The dielectric oxide layer will later form the gate oxide layer for the MOSFETs 2, 3. After the formation of the gate oxide, n$^+$-polysilicon spacers are formed by depositing polysilicon in the etched trench 21 and by subsequently strictly anisotropic etching back of the deposited polysilicon. The polysilicon spacers are then used as masking for structuring of the insulating oxide layer located at the bottom of the trench. The insulating oxide layer located at the bottom of the trench is etched selectively, so that the structure illustrated in FIG. 2 is produced. The current-conductive channel 40 and the dielectric oxide layer 41 are only shown in FIG. 2 for the transistor 3 to simlify the drawings.

FIG. 2 is a section view through the silicon semiconductor substrate area after the process steps described above have been carried out. The nitride hard-mask layer 20 can be seen, under which the n-polysilicon layer 24 is located on the left-hand web 22. This is followed on both sides by layers 25, 26, which are produced by the n-ion implantation. There is likewise an n-doped region 27, which is produced by n-ion implantation, at the bottom of the etched trench 21. The structured insulating oxide layer is located above the n-doped region 27 on the bottom of the etched trench 21. The structured insulating oxide layer contains two oxide strips 30, 31 which run parallel to the sidewalls 28, 29. The center of the bottom of the etched trench 21 is exposed, as can be seen in FIG. 2. The two n-polysilicon spacers 32, 33 are disposed above the two oxide strips 30, 31. There are gate oxide layers 41 on each of the sidewalls 28, 29 of the etched trench 21.

Figure 4:
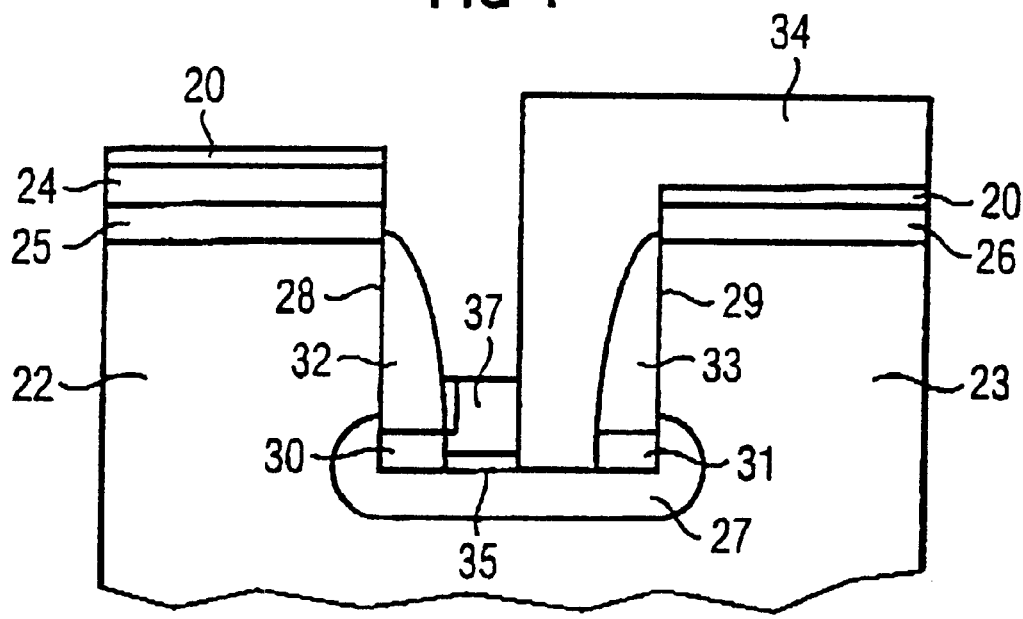

The etched trench 21 is now once again filled with silicon dioxide using a TEOS process, and is structured in a photographic process such that only half the trench now remains filled with silicon dioxide. In a thermal process, a thin dielectric layer is deposited on the remaining, exposed half of the rear surface area of the substrate at the bottom of the etched trench 21. The thin dielectric layer is in this case preferably composed of a NO compound. During this oxide nitridation process, the left-hand spacer 32 shown in FIG. 2 is likewise covered with the oxide-nitride compound. This results in the structure shown in FIG. 3. It can be seen from FIG. 3 that the right-hand side of the etched trench 21 is half filled with an insulating material 34. The insulating material 34 is in this case composed, for example, of silicon dioxide. A thin dielectric layer 35, which is preferably composed of a nitrogen-oxygen compound, is located between the oxide layer 30 and the insulating filling material 34 at the bottom of the etched trench 21. Furthermore, the left-hand spacer 32 is coated with a layer 36 composed of a nitrogen-oxygen compound. The left-hand side of the etched trench 21 shown in FIG. 3 is then filled with n-polysilicon, and the polysilicon is etched back to such an extent that a poly-plug 37 remains, as can be seen in FIG. 4. Wet-chemical etching is used to removed the thin layer 36, which is composed of a nitrogen-oxygen compound, on the exposed spacer 32, and the spacer 31 is connected via an n-polysilicon layer 38 to the poly-silicon plug 37 by further deposition of polysilicon, which is then etched back. After a further photographic process, the spacer 32 and the plug 37, 38 are now structured such that they remain only in the silicon substrate areas 25, and are removed in the areas 26 that are composed of insulating oxide.

The entire structure is then filled with an intermediate oxide and is provided with metallization. In the process, the doped area 26 on the right-hand web 23 is provided with a bit line metal contact 39.

Figure 5:
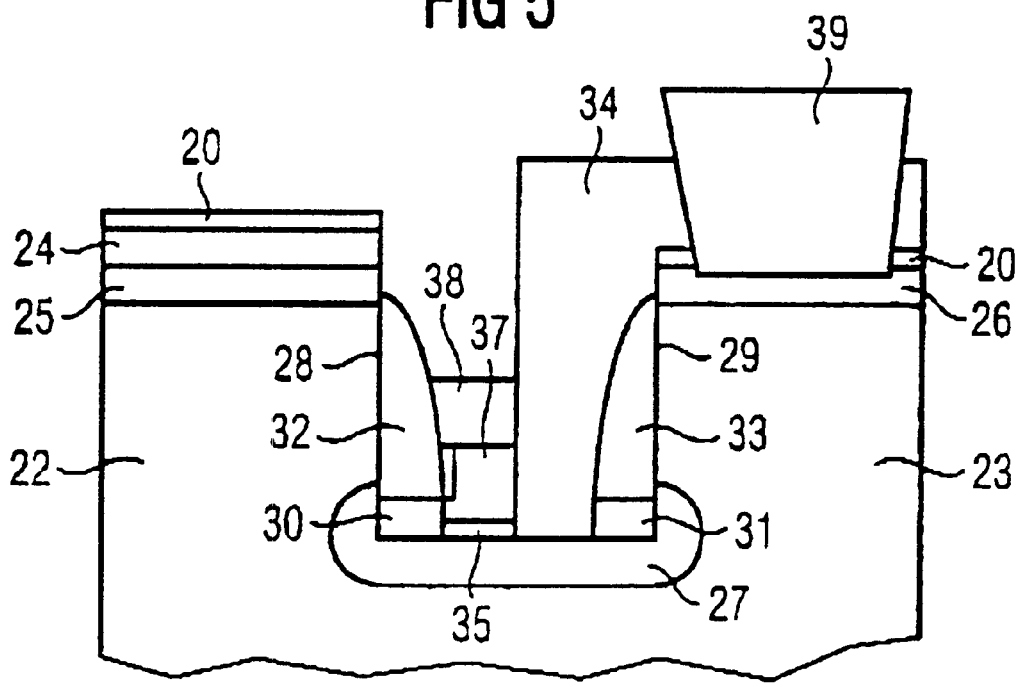

FIG. 5 shows a first embodiment of the integrated dynamic memory cell 1 according to the invention, which is produced using the production method described above. In the structure shown in FIG. 5, the two MOSFETs 2, 3 of the memory cell 1 are opposite one another in the trench 21. Corresponding to the circuit diagram illustrated in FIG. 8, the MOSFET located on the left-hand side in FIG. 5 forms the memory MOSFET 3 and the MOSFET located on the right-hand side forms the selection MOSFET 2. The gate 8 of the selection transistor 2 is formed by the spacer 33, and the gate 15 of the memory transistor 3 is formed by the spacer 32. The n-doped layer 25 represents the drain connection of the memory MOSFET 3, and is connected to the supply voltage $V_{DD}$ for the memory. The n-doped area 26 forms the source connection area of the selection transistor 2, with the metal contact 39 forming the bit line connection 5. The drain doping area of the selection transistor 2 located on the right and the source doping area of the memory transistor 3 located on the left are connected to one another via the connection doping region 27 at the bottom of the etched trench 21. The doping region 27 at the bottom of the etched trench 21 forms the conductive connection 12 between the drain connection 11 of the selection transistor 2 and the source connection 13 of the memory transistor 3.

The component 16, which is similar to a diode, in FIG. 8 is formed by the thin dielectric layer 35. The thin dielectric layer 35 is in this case composed of an oxide, nitride or an oxynitride. The selection MOSFET 2 on the right-hand side of the etched trench 21 has a gate connection area which is connected to the word line WL. The selection MOSFET 2 furthermore has a source connection doping area 26 which is connected via the metal contact 39 to the bit line BL.

The memory MOSFET 3 has a gate connection area 32, which is connected via the thin dielectric layer 35 to the connection doping region 27. The connection doping region 27 connects a source connection doping area of the memory MOSFET 3 on the left-hand side of the etched trench 21 to the drain connection doping area of the selection MOSFET 2 on the right-hand side of the etched trench 21. The drain connection doping area 14 of the memory MOSFET 3 is supplied with the supply voltage $V_{DD}$ for the memory. The selection MOSFET 2 and the memory MOSFET 3 are disposed on the sidewalls 28, 29 in the trench 21 which is etched in the semiconductor substrate, such that they are opposite one another, with the connection doping region 27 forming the bottom of the etched trench 21.

The embodiment shown in FIG. 5 shows the two NMOS MOSFETs 2, 3. However, in an alternative embodiment, PMOS MOSFETs can also be produced by the production method according to the invention.

The thin dielectric layer 35 is formed to be sufficiently thin that tunnel currents can flow through it between the gate connection area 32 of the memory MOSFET 3 and the connection doping region 27. In this case, the tunnel currents which flow through the thin dielectric layer 35 can be varied by the doping of the n-polysilicon area 37 and by the doping of the connection doping region 27. The thin dielectric layer 35 in this case preferably has a thickness of less than 2 nm.

The etched trench 21 can in principle be etched to any desired depth. A width of the etched trench 21 preferably corresponds to the minimum lithographic structure size F. Since a length of the doped current-conductive channels which run parallel to the sidewalls 28, 29 of the etched trench 21 can be fixed by the etching depth of the trench 21, leakage currents which flow from the memory cell 1 via the selection transistor 2 via the bit line connection 5 can be controlled by increasing the length of the doped current-conductive channels.

The gate connection areas 33 of the selection MOSFET 2 located on the right-hand side, which form the gate 8, run continuously through the etched trench 21. The gate connection area 33 of the selection MOSFET 2 in the dynamic memory cell 1 is formed by an n-polysilicon spacer 33 which runs continuously in the etched trench 21 and at the same time forms the gate connection areas for a large number of further selection MOSFETs for further dynamic memory cells 1.

Since the width of the etched trench 21 corresponds approximately to the minimum lithographic structure size F, and the distance between the insulating trenches 21 in the semiconductor substrate likewise corresponds approximately to the separation distance for a minimum lithographic structure size F, the memory cell 1 according to the invention has a side length which is approximately twice as great as the minimum lithographic structure size F. In a corresponding way, the area of extent of the dynamic memory cell 1 according to the invention is approximately four times the square of the lithographic structure size $4F^2$.

The production method according to the invention for the dynamic memory cell can be varied. For example, in order to minimize any leakage currents at the PN junctions at the bottom of the trench, the doping can be carried out from a phosphorus or arsenic-glass layer at the bottom of the trench, instead of by n-ion implantation into the bottom of the trench.

In a further embodiment of the memory cell according to the invention, the n-polysilicon layer 24 is configured to be very thick for connection to the supply voltage, in order to allow a greater overlap capacity between the supply voltage connection and the gate connection area 32 of the memory MOSFET 3.

Figure 6:
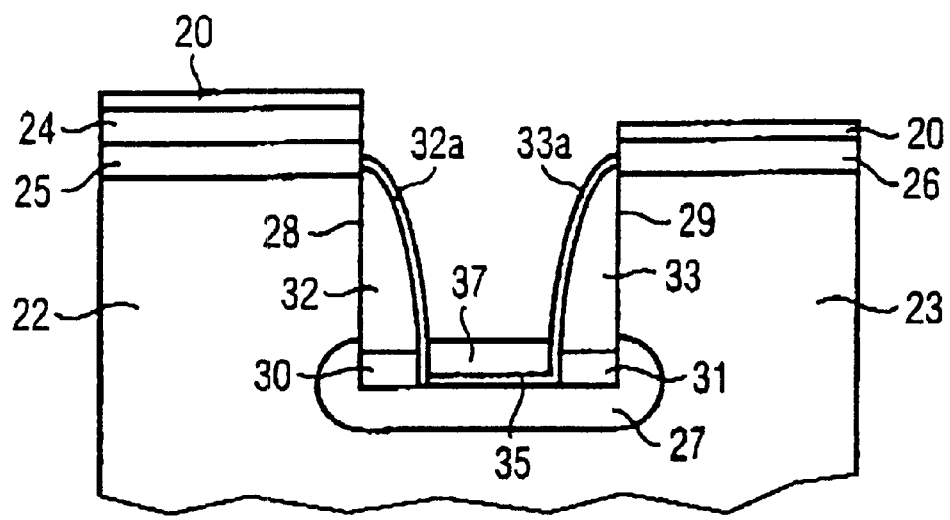
FIGS. 6 and 7 are sectional views of production steps for an alternative embodiment of the dynamic memory cell according to the invention.

In one alternative embodiment of the production method according to the invention, the process after structuring of the polysilicon spacers 32, 33 and of the insulating oxide layer at the bottom of the trench can be reversed. In this case, a thin spacer composed of silicon dioxide is applied over the polysilicon spacers 32a, 33a. The thin dielectric layer 35 is then grown thermally at the bottom of the trench, and the polysilicon plug 37 above it is produced by deposition and etching back. The structure formed in this way can be seen in FIG. 6.

Figure 7:
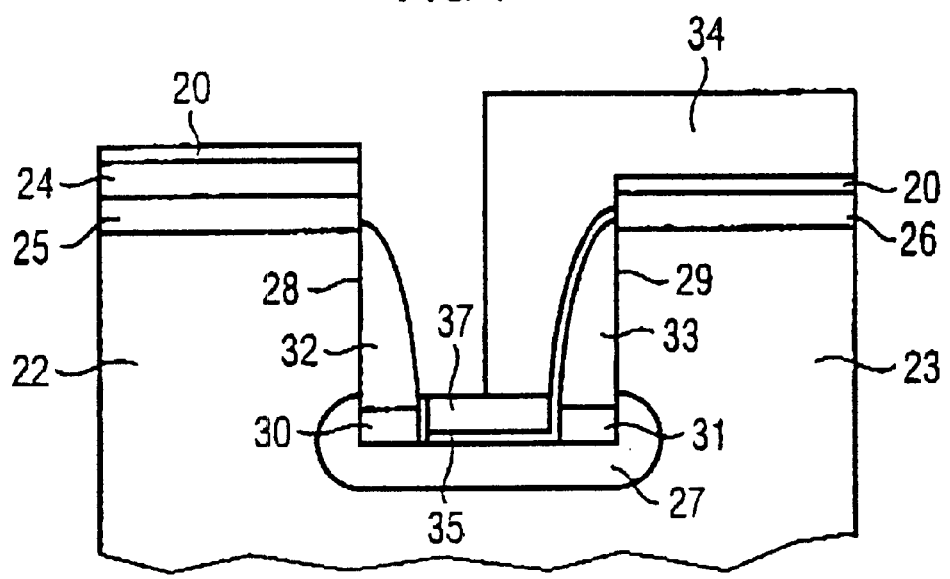

After this, the structure is filled with silicon dioxide. Dry structuring is then carried out using a photographic process by etching, in which only the memory MOSFET 3 remains exposed. The dry etching in this case also avoids the spacers formed from silicon dioxide. An n-polysilicon spacer which is deposited and structured after this then connects the polysilicon plug to the gate connection area of the memory MOSFET, as can be seen in FIG. 7.

The gate connection spacers of the memory MOSFET 3 and the plug are then structured by etching such that they remain only on the trench walls formed from silicon semiconductor substrate, but are removed on those trench walls which are composed of insulating oxide. The entire structure is then once again covered with an intermediate oxide layer, and metallization is carried out.

We claim:

1. An integrated dynamic memory cell having a small area of extent, comprising:
    a semiconductor substrate having a trench formed therein and defined by a bottom and side walls, including a first side wall and a second side wall opposite said first side wall;
    a selection MOSFET disposed on said first side wall of said trench, said selection MOSFET having a gate connection area which is to be connected to a word line, a source connection doping area which is to be connected to a bit line, and a connection doping area forming said bottom of said trench and a drain connection doping area of said selection MOSFET;
    a thin dielectric layer;
    a memory MOSFET disposed on said second side wall of said trench and having a source connection doping area, a gate connection area which is connected through said thin dielectric layer to said connection doping region and said connection doping region connecting said source connection doping area of said memory MOSFET to said drain connection doping area of said selection MOSFET, and said memory MOSFET having a drain connection doping area which is to be connected to a supply voltage; and
    a connecting area formed from n-polysilicon connected to said thin dielectric, and tunnel currents flowing through said thin dielectric layer can be varied by a doping of said connecting area and by a doping of said connection doping region, said thin dielectric layer having a thickness of less than two nm so that the tunnel currents flow between said gate connection area of said memory MOSFET and said connection doping region.

2. The memory cell according to claim 1, wherein said selection MOSFET and said memory MOSFET are NMOS transistors.

3. The memory cell according to claim 1, wherein said thin dielectric layer has an asymmetric current flow characteristic.

4. The memory cell according to claim 1, wherein said thin dielectric layer is composed of a material selected from the group consisting of oxides, nitrides and oxynitrides.

5. The memory cell according to claim 1, wherein said selection MOSFET and said memory MOSFET each have a gate oxide layer running along said side walls of said trench.

6. The memory cell according to claim 5, including doped current-conductive channels disposed alongside said gate oxide layer of said selection MOSFET and of said memory MOSFET and their doping can be varied in order to fix a respective switch-on voltage of said selection MOSFET and said memory MOSFET.

7. The memory cell according to claim 6, wherein said doped current-conductive channels are produced by ion implantation.

8. The memory cell according to claim 6, wherein said doped current-conductive channels each have a length corresponding to a depth of said trench.

9. The memory cell according to claim 1, wherein said gate connection area of said selection MOSFET and said gate connection area of said memory MOSFET are spacers.

10. The memory cell according to claim 1, wherein said source connection doping area, said drain connection doping area and said connection doping region are produced by ion plantation.

11. The memory cell according to claim 1, wherein said trench has a width corresponding to a minimum lithographic structure F.

12. The memory cell according to claim 11, wherein said trench has a depth that is greater than said width of said trench.

13. The memory cell according to claim 1, wherein said gate connection area of said selection MOSFET is a spacer running continuously in said trench and forms gate connection areas for a large number of further selection MOSFETs of further dynamic memory cells.

14. The memory cell according to claim 1, wherein the area of extent of the memory cell is approximately four times a square of a minimum lithographic structure size $F^2$.

15. The memory cell according to claim 1, including an insulation layer disposed in said semiconductor substrate for separating said selection MOSFET from further selection MOSFETs of different memory cells which are disposed on said first side wall of said trench.

16. The memory cell according to claim 1, including an insulation layer disposed said semiconductor substrate for separating said memory MOSFET from further memory MOSFETs which are disposed on said second side wall of said trench.

* * * * *